(12) United States Patent
Srivastava et al.

(10) Patent No.: US 6,531,069 B1
(45) Date of Patent: Mar. 11, 2003

(54) REACTIVE ION ETCHING CHAMBER DESIGN FOR FLIP CHIP INTERCONNECTIONS

(75) Inventors: Kamalesh K. Srivastava, Wappingers Falls, NY (US); Peter C. Wade, Hyde Park, NY (US); William H. Brearley, Poughkeepsie, NY (US); Jonathan H. Griffith, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 09/599,761

(22) Filed: Jun. 22, 2000

(51) Int. Cl.[7] .............................................. C03C 15/00
(52) U.S. Cl. ............................. 216/67; 216/70; 438/9; 438/707; 438/710; 204/298.07; 204/298.08; 204/298.11; 204/298.31; 156/345; 118/723 R
(58) Field of Search ...................... 113/723 R; 156/345; 204/298.07, 298.08, 298.11, 298.31; 216/67, 70; 438/707, 9, 710

(56) References Cited

U.S. PATENT DOCUMENTS

| | | | |
|---|---|---|---|
| 4,352,974 A | 10/1982 | Mizutani et al. | 219/121 PD |
| 4,761,219 A * | 8/1988 | Sasaki et al. | 156/345.46 |
| 5,009,738 A | 4/1991 | Gruenwald et al. | 156/345 |
| 5,110,437 A | 5/1992 | Yamada et al. | 204/298.33 |
| 5,607,542 A * | 3/1997 | Wu et al. | 118/723 I |
| 5,766,498 A | 6/1998 | Kojima et al. | 216/71 |
| 5,834,730 A | 11/1998 | Suzuki et al. | 219/121.43 |
| 5,980,687 A | 11/1999 | Koshimizu | 156/345 |
| 6,014,943 A | 1/2000 | Arami et al. | 118/723 E |

FOREIGN PATENT DOCUMENTS

| | | | | |
|---|---|---|---|---|
| JP | 62089736 A | * | 4/1987 | B01J/19/08 |
| JP | 01202821 A | | 2/1988 | H01L/21/302 |
| JP | 01306583 A | | 6/1988 | C23F/4/00 |
| JP | 05275384 A | | 3/1992 | H01L/21/302 |

OTHER PUBLICATIONS

Alfred Grill. Plasma in Materials Fabrication. IEEE press. ISBN 0–7803–1055–1, Dec. 1994. pp. 96–11, 152.*

* cited by examiner

Primary Examiner—Randy Gulakowski
(74) Attorney, Agent, or Firm—Graham S. Jones, II; Ira D. Blecker

(57) ABSTRACT

RIE processing chambers includes arrangements of gas outlets which force gas-flow-shadow elimination. Means are provided to control and adjust the direction of gases to the outlet to modify and control the direction of plasma flow at the wafer surface during processing. Means are provided to either move the exhaust paths for exhaust gases or to open and close exhaust paths sequentially, in a controlled manner, to modify flow directions of ions in the etching plasma. A combination of rotation/oscillation of a magnetic field imposed on the RIE chamber can be employed by rotation of permanent magnetic dipoles about the periphery of the RIE chamber or by controlling current through a coil wrapped around the periphery of the RIE process chamber to enhance the removal of the residues attributable to gas-flow-shadows formed by linear ion paths in the plasma.

16 Claims, 9 Drawing Sheets

REACTIVE ION ETCHING CHAMBER DESIGN FOR FLIP CHIP INTERCONNECTIONS

BACKGROUND OF THE INVENTION

1. Field of the Invention

This invention relates to reactive ion chambers and methods of operation thereof and more particularly to a method and apparatus for overcoming nonuniformity of etching in the presence of tall structures on a substrate.

2. Description of Related Art

FIG. 1A shows a schematic diagram of a vertical elevation of one type of conventional Prior Art RIE (Reactive Ion Etching) system which is housed in a RIE etching chamber C and which is used to remove a film from the exposed surface of a workpiece such as silicon semiconductor wafer W. There is a inlet flow IF of etching gases supplied to inlet GI to the by RIE chamber C. At the top of chamber C, a gas input line GI supplies that inlet flow IF of fresh reactive gases to the top center of the inlet manifold IM of a gas-shower head SH. The gas-shower head SH comprises an inlet manifold IM and a combined ventilator and metallic upper electrode UE with an array of widely and evenly dispersed, parallel, vertical vent holes VH therethrough. Thus, the reactive etching gases IF are fairly uniformly dispersed at the outlets of the vent holes. VH in the gas-shower bead SH. The vent holes VH communicate between the inlet manifold IM and an ionization space IS within the chamber C between the upper electrode UE and a disk-shaped lower electrode LE, upon which the wafer W is supported. The disk-shaped lower electrode LE has an upright vertical axis parallel to the vertical axis of the chamber C. The upper electrode UE and lower electrode LE are energized by application thereto of RF electrical power (applied to the bottom lower electrode LE, or the lower electrode LE and upper electrode UE both). When the upper and the lower electrodes UE and LE are energized, in the presence of an appropriate pressure/flow rate combination the electrodes UE and LE generate a plasma, i.e. ionize the reactive etching gases IF. The plasma exists between the upper electrode UE and the lower electrode LE, which causes selective etching by chemical reactions between the etching gases in the plasma and an unwanted layer of material on the surface of wafer W. The etching process removes that unwanted layer on the surface of the wafer W in a selective process In other words, the plasma interacts with the unwanted film on the top surface of the wafer W to remove that film. To continue the etching process to completion, a constant supply of etching gases IF must enter gas inlet GI and pass through the manifold, IM and the upper electrode US and vent holes VH into the ionization space IS in the RIE etching chamber C. To that end the outflowing gases OF which have been produced by the etching process arc exhausted from the ionization space IS though exhaust holes EH in a gas outlet plate OP below the lower electrode LE. The exhaust holes EH are located on a larger radius from the center of the lower electrode LE. Two outlet gas flow paths OF are shown to the two exhaust holes EH in the gas outlet plate OP in FIG. 1A. Below the gas outlet plate OP is an outlet manifold OM connected to a main gas outlet GO from which the exhaust gases EF are removed by a pump (not shown).

FIG. 1B shows a schematic, plan view of the configuration of the outlet plate OP of FIG. 1A with a 360° ring of exhaust holes EH extending vertically therethrough from top to bottom. The exhaust holes EH through the gas outlet plate OP are located just beyond the periphery of the wafer W. In the chamber C, the gas pressure is maintained low enough so that it is approximately correct to show a straight line, radial flow of ionized species from center to edge of the wafer W. These flow paths are based upon the path the average ions or molecules in the mass of the gases which pass through the ionization space IS from a single hypothetical vent hole VH (now shown) to give an overall impression of the linear flow from vent holes VH to exhaust holes EH. Because of random motion caused by molecular and ionic collisions some scattering of molecules and ions occurs but the arrows are indicative of the overall average, linear motion of ions and molecules from vent holes VH to exhaust holes EH.

FIG. 1C is an enlarged, fragmentary, schematic, plan view of a single exhaust hole EH with arrows showing a number of flow paths FP for the etching gases approaching a single exhaust hole EH. The arrows indicate a number of straight line paths to that exhaust hole EH which originated at a number of vent holes VH (not shown).

In the configuration of FIGS. 1A and 1B, the ionized gaseous species run, i.e flow, directly from all over the wafer surface to the nearest edge of the wafer W, forming a plurality radial paths of the ionized gaseous species as indicated by FIG. 1C. The flux of the ions is minimum at the center and maximum near the edge. The etch rate is minimum at the center and maximum near the edge. In the absence of any tall (100 micron) feature on the wafer surface, this etch rate non-uniformity can be easily controlled within one sigma ($\Sigma$) of 10%.

In the presence of the flip chip interconnection features like tall (100 micron) solder bumps or any relatively tall features, the flow of the ionized gaseous species on the surface of the wafer is obstructed by each of the such tall features such as solder bump SB shown on wafer W in FIG. 2A and an ion path IP1 hypothetically followed by an ion travelling along a straight line just missing interception by the upper edge of the solder bump SB from a point source, i.e. a vent hole VH in FIG. 1A. Therefore, each of such flip chip interconnection features forms a number of overlapping shadows SA (extending radially on the surface of wafer W towards the edge) where reduced or even minimal interaction occurs with the top layer film to be etched, resulting in very little etching deep within the exemplary shadow region SR shown formed in the shadow area SA on the surface of wafer W in FIG. 2A. Experimental data has shown that irrespective of the extent of overetching applied, feature shadows remain in the areas of minimal etching.

FIG. 2B shows a plan view of FIG. 2A showing that with two linear ion paths IP1 and IP2, the shadows SA are widest and least accessible near the bottom of the "shaded" or leeward side of the solder bump SB.

U.S. Pat. No. 5,980,687, of Koshimizu for "Plasma Processing Apparatus Comprising a Compensating-Process-Gas Supply Means in Synchronism with a Rotating Magnetic Field" teaches use of a compensating rotating process gas inlet assembly with the rotation of the magnetic field generated by an assembly of magnets. The Koshimizu patent indicates that with the arrangement shown therein a more uniform plasma is generated leading to uniform etching. That is a method appropriate for use when surface to be etched is substantially nearly flat.

U.S. Pat. No. 6,014,943 of Arami et al. for "Plasma Process Device" describes dipole ring magnet apparatus surrounding a plasma generating chamber.

U.S. Pat. No. 5,834,730, of Suzuki et al. for "Plasma Processing Equipment and Gas Discharging Device" describes a system which includes a gas discharging device which enables CVD (Chemical Vapor Deposition) film deposition in a multiple chamber set up. The Suzuki et al. patent also describes use of the same gas discharging device in multiple chamber RIE setup.

U.S. Pat. No. 5,766,498 of Kojima et al. for "Anisotropic Etching Method and Apparatus" describes improving planar RIE uniformity by creating temperature gradient in a gas-shower head and making the gas-shower head larger than the size of the wafer.

U.S. Pat. No. 5,110,437 of Yamada et al. for "Processing Apparatus" describes an arrangement which allows up and down movement of the process gas inlet and outlet pipes. The patent indicates that the method described therein would allow a user to employ more process chamber variables to optimize the RIE process.

U.S. Pat. No. 5,009,738, dated Apr. 23, 1991 of Gruenwald et al. for "Apparatus for Plasma Etching" describes a chamber design allowing a fixed set of selectable outlet holes in a stationary exhaust plate so the user can employ more process chamber variables to optimize the RIE process.

U.S. Pat. No. 4,352,974, dated Oct. 4, 1982 Mizutani et al. for "Plasma Etcher having Isotropic Subchamber with Gas Outlet for Producing Uniform Etching" shows a chamber design with an extended gas outlet subchamber. The gases exhaust radially outward.

Patent Abstracts of Japan Publication No. 01202821 A, dated Feb. 8, 1988 of Yasuyuki et al. for "Reactive Ion Etching Apparatus" shows a chamber design with a mechanism for rotating a wafer and processing gases exhaust radially outward.

Patent Abstracts of Japan Publication No. 015275384 A, dated Mar. 30, 1992 of Takashige for "Production Apparatus for Semiconductor Device" describes a parallel plate for a RIE plasma etching system "with gas blow-out outlets . . . to blow out gas to a semiconductor substrate . . . in a diagonal direction and a plurality of purging holes . . . on the side wall around a support table . . . for the substrate . . . . Thus the gas can be uniformly distributed on the surface of the substrate . . . ."

However, it is believed that none of the above references overcomes the problem of structures which cause "gas flow shadows" that produce nonuniformity of etching.

SUMMARY OF THE INVENTION

In accordance with this invention RIE processing chambers have gas outlets designed to force gas-flow-shadow elimination. Means are provided to control and adjust the direction of gases to the outlet to modify and control the direction of plasma flow at the wafer surface during processing. Means are provided to either move the exhaust paths for exhaust gases or to open and close exhaust paths sequentially, in a controlled manner, to modify flow directions of ions in the etching plasma. Furthermore, a combination of rotation/oscillation of the magnetic field imposed on the RIE chamber is employed by control of current through a coil wrapped around the RIE process chamber to enhance the removal of the residues attributable to gas-flow-shadows formed by linear ion paths in the plasma or rotation of the magnetic field by providing a set of dipoles rotated about the periphery of the RIE chamber.

Further in accordance with this invention, a method is provided for performing RIE in an RIE chamber on a work supporting surface and an ionization space above the work supporting surface by the following steps. Provide peripheral exhaust openings on the periphery of the ionization space. Supply a reactive species into the ionization space. Form a plasma of the reactive species in the ionization space. Impart vector forces to the plasma of the reactive species to divert the paths thereof with continuously varying vectors so the reactive species follow non-linear paths thereby counteracting shadow effects of the RIE process relative to tall structures and asperities on workpiece surfaces. Apply vectors by rotation of the peripheral exhaust openings or by rotation of access to the peripheral exhaust openings, preferably along a limited arc. Preferably, apply vectors sequentially by rotation of opening and closing of the peripheral exhaust openings or by rotation of a shutter relative to the peripheral exhaust openings. Alternatively, apply vectors by rotation of the reactive species in the plasma by electromagnetic forces or by rotation of a magnetic field about the ionization space; or apply vectors by rotation of a permanent magnets about the ionization space or by application of an electromagnetic field about the ionization space and reversal of the electromagnetic field.

In accordance with another aspect of this invention, a RIE system is provided including a RIE chamber, with a work supporting surface and an ionization space above the work supporting surface. A plurality of peripheral exhaust openings are located on the periphery of the ionization space. Distribution means supply a reactive species into the ionization space. Electrodes are provided for forming a plasma of the reactive species in the ionization space. There are means for imparting vector forces to the plasma of the reactive species diverting the paths thereof with continuously varying vectors. As a result the reactive species follow non-linear paths thereby counteracting shadow effects of the RIE process relative to tall structures and asperities on workpiece surfaces. The vectors can be applied by rotation of the peripheral exhaust openings or by rotation of access to the peripheral exhaust openings, preferably along a limited arc. Preferably, the vectors are applied sequentially by rotation of opening and closing of the peripheral exhaust openings or by rotation of a shutter relative to the peripheral exhaust openings. Preferably the vectors are applied by rotation of the reactive species in the plasma by electromagnetic forces or by rotation of a magnetic field about the ionization space. The vectors are applied by rotation of a permanent magnets about the ionization space or by application of an electromagnetic field about the ionization space and reversal of the electromagnetic field.

BRIEF DESCRIPTION OF THE DRAWINGS

The foregoing and other aspects and advantages of this invention are explained and described below with reference to the accompanying drawings, in which:

FIG. 1A shows a schematic diagram of a vertical elevation of one type of conventional RIE etching system, which is used to remove a film from the exposed surface of a workpiece such as silicon semiconductor wafer. FIG. 1B shows a schematic, plan view of the configuration of an outlet plate of the system of FIG. 1A with a 360° ring of exhaust holes extending vertically therethrough from top to bottom.

FIG. 3 shows an elevational section of a schematic diagram of a RIE chamber comprising one embodiment of this invention. FIGS. 4A–4C show several plan views of a portion of the system of FIG. 3 with the wafer on top of the lower electrode which in turn is surrounded by a rotating exhaust ring with a narrow arc of outlet holes therethrough which are rotating with the rotating exhaust ring. FIGS. 4A–4C show the exhaust ring in a series of positions as it rotates about the wafer and the lower electrode of the RIE chamber.

DESCRIPTION OF THE PREFERRED EMBODIMENT

This invention employs a method and system for providing uniform RIE etching of a film by the continuous elimination of gas-flow-shadows formed in the gas-flow-shadows behind elevated features on the wafer by employing a continuously rotating/oscillating controlled flow pattern directing the ionized gaseous species along ever changing paths between the inlets to the plasma space and the exhausts from the plasma space. The flow pattern of the ionized gaseous species can be influenced by as follows:

1) mechanical design of the outlet configuration, or
2) an electromechanical design, or
3) an electromagnetic design, or
4) a combination thereof 1, 2 and 3 above.

First Embodiment

Figure 1A:
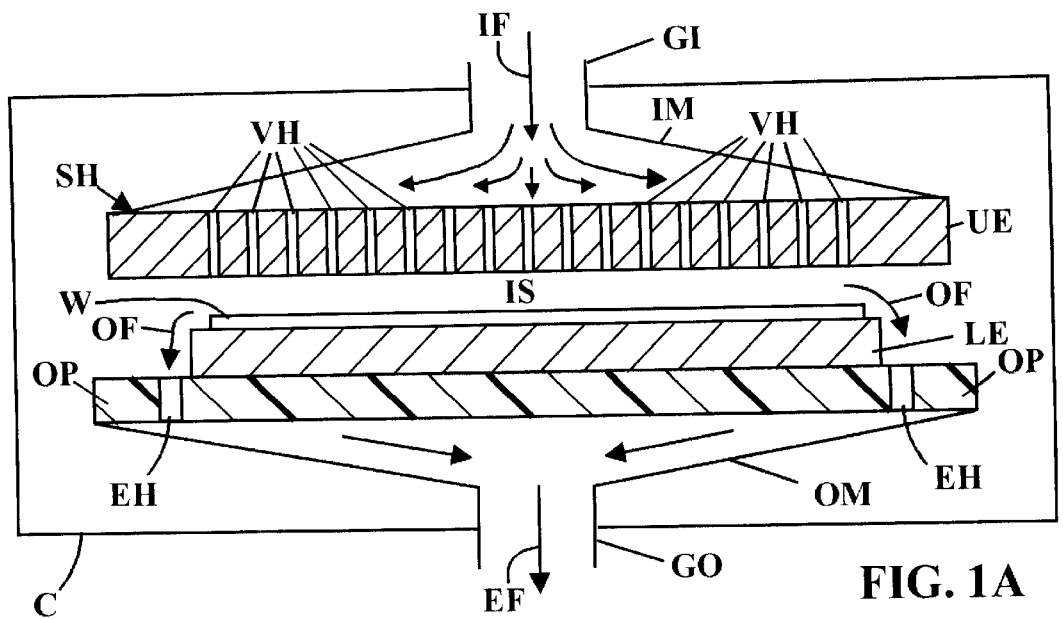
FIGS. 1A–1B shows aspects of a Prior Art RIE system.
Figure 1B:
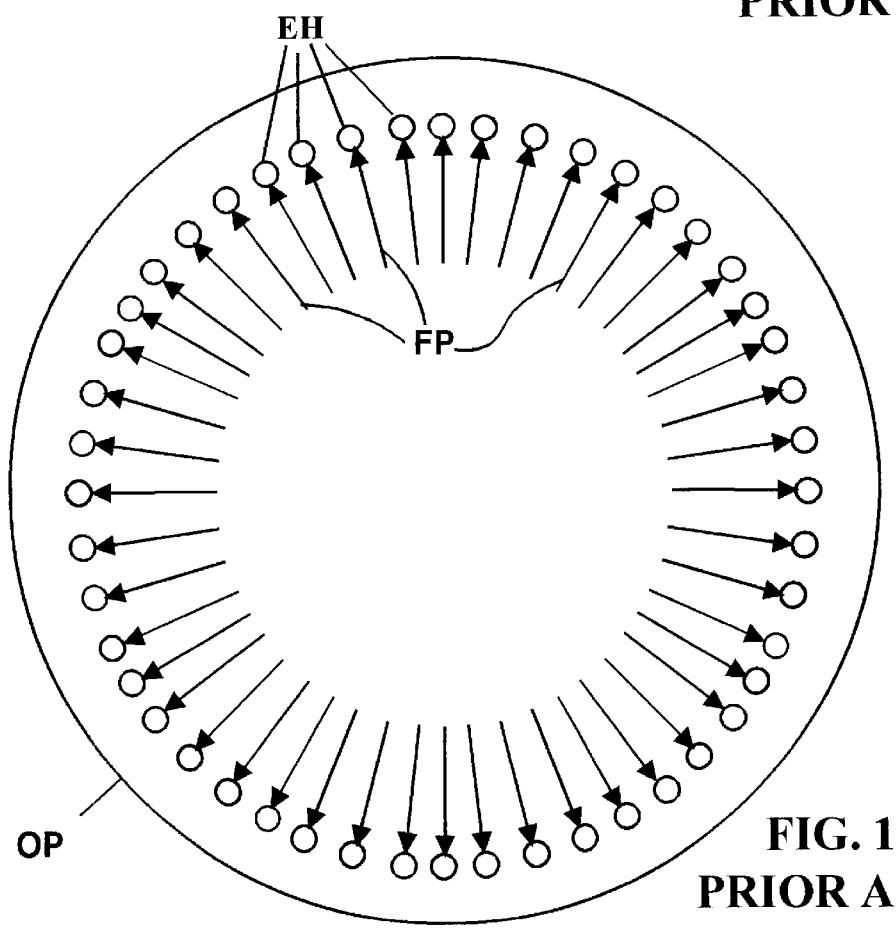
Figure 1C:
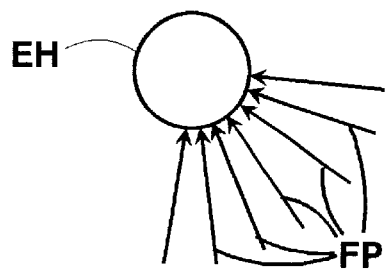
FIG. 1C is an enlarged, fragmentary, schematic, plan view of a single exhaust hole of FIG. 1B with arrows showing a number of flow paths FP for the etching gases approaching a single exhaust hole.
Figure 3:
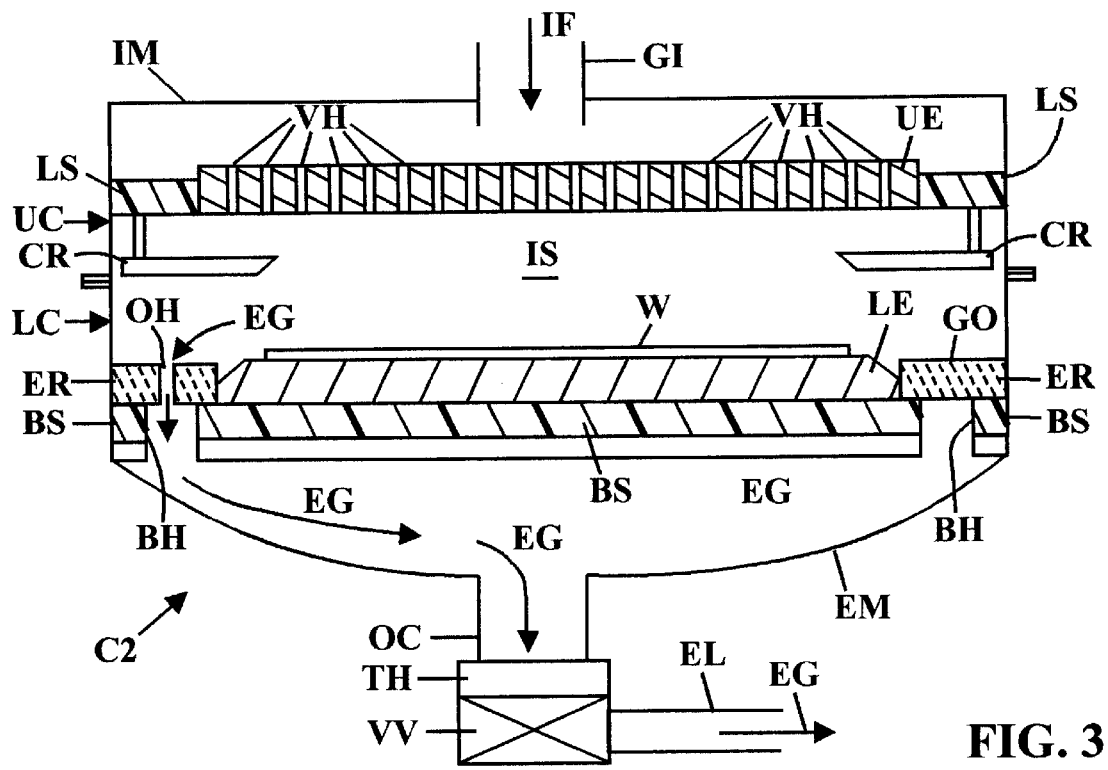
FIG. 3 and FIGS. 4A–4C illustrate a mechanical design embodying the method and the apparatus for practicing this invention.
Figure 4A:
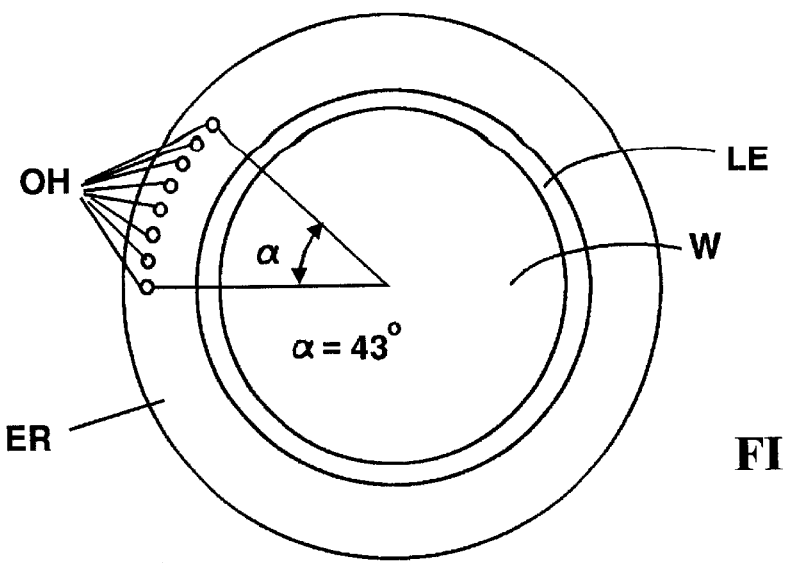

FIG. 3 and FIGS. 4A–4C illustrate a mechanical design embodying the method and the apparatus for practicing this invention. FIG. 3 shows an elevational section of a schematic diagram of an RIE chamber C2 which consists of an upper chamber UC and a lower chamber LC joined together by flanges. In the upper chamber UC, an upper electrode UE is supported by an electrically insulating lateral support LS. In the lower chamber LC, a lower electrode LE is supported by a base BS composed of an insulating material which is secured to the sidewalls of the lower chamber LC. As in FIG. 1A, the wafer W in the chamber C2 rests in a fixed position on the top surface of a disk-shaped lower electrode LE with an upright vertical axis. The fresh, reactive gas IF being supplied for use for the RIE process enters a gas inlet GI which directs the reactive gas IF to an inlet manifold IM located on top of the upper chamber UC. From the inlet manifold IM as the gas passes down onto the exposed surface of the upper electrode, a gas-shower is produced as the reactive gas IF passes through all of the vent holes VH in the upper electrode UE into the ionization space IS between the energized upper electrode UE and the lower electrode LE to form a RIE plasma. The plasma generated in the ionization space IS is in contact with the upper surface of the wafer W. Surrounding the lower electrode LE on the periphery thereof is a rotating exhaust ring ER coaxial with the lower electrode LE. The rotating exhaust ring ER is formed of an electrically insulating dielectric material with a few outlet holes OH, as shown in FIG. 4A, which are arranged quite differently from the numerous exhaust holes EH of FIGS. 1A and 1B. As the exhaust gas EG from the ionization space IS passes beyond the periphery of the wafer W, the exhaust gas EG exits through the outlet holes OH, wherever they happen to be located in the continuous rotation of exhaust ring ER. Below each outlet hole OH, as shown in FIG. 3, is an opening BH in base BS which communicates from outlet hole OH to an exhaust manifold EM. The exhaust gas EG passes through the exhaust manifold EM into an outlet conduit OC which connects to a throttle TH which leads to a vacuum valve VV. Vacuum valve VV leads to exhaust line EL to a pump (not shown) which draws exhaust gases EG along and draws reactive gases into the gas inlet GI because of the vacuum created by the pump in the exhaust line EL by the pump.

Figure 4B:
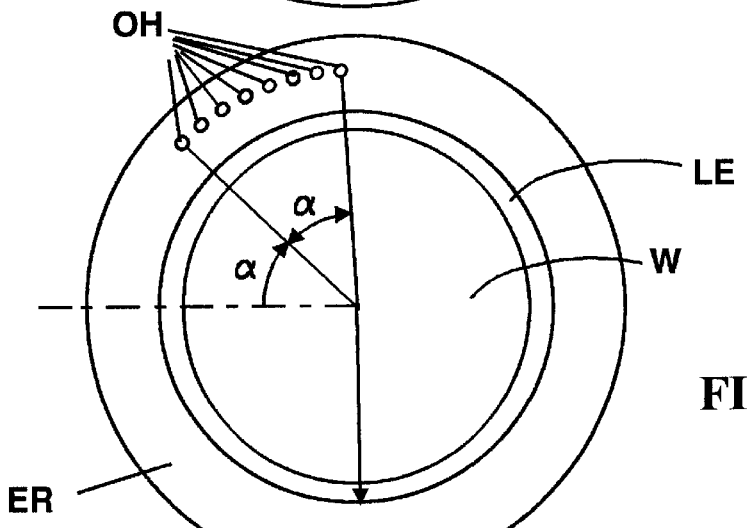
Figure 4C:
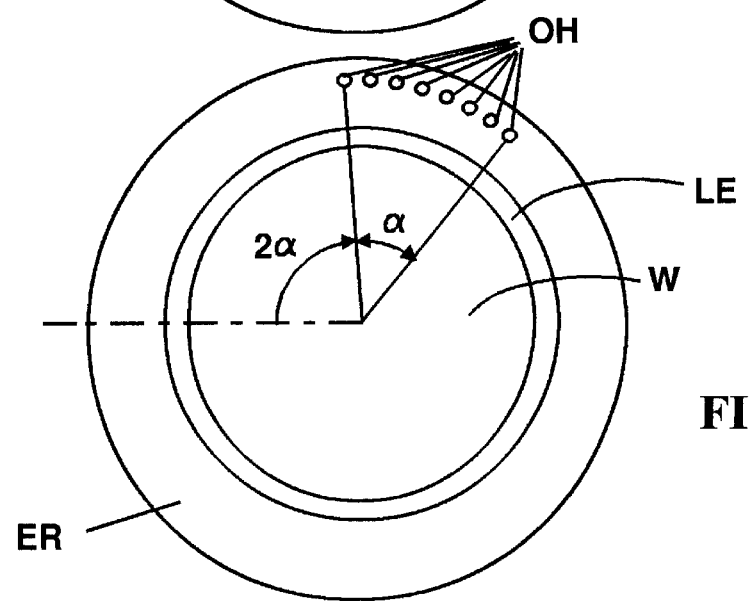

FIGS. 4A–4C show several plan views of a portion of the system of FIG. 3 with the wafer W on top of the lower electrode LE which in turn is surrounded by the rotating exhaust ring ER with a narrow arc of outlet holes OH therethrough which are rotating with the rotating exhaust ring ER. FIGS. 4A–4C show the exhaust ring ER in a series of positions as it rotates about the wafer W and the lower electrode LE of the RIE chamber C.

FIG. 4A shows a plan view of a portion of the system of FIG. 3 with the wafer W on top of the lower electrode LE, which in turn is surrounded by exhaust ring ER, in the position shown in FIG. 3 with the outlet holes OH on the left, above the openings BH as shown in FIG. 3.

In FIGS. 4A–4C the continuously rotating exhaust ring ER is shown in a few of a continuous sequence of successive positions with a short arc of eight outlet holes OH extending down through the exhaust ring ER. In FIG. 3, only a single one of the outlet holes OH is shown extending through the exhaust ring ER on the left side of the lower electrode LE. Note that in FIG. 3, there is no outlet hole OH shown in the portion of exhaust ring ER seen on the right side of lower electrode LE in accordance with the design of this embodiment of the invention at the position of the exhaust ring ER shown in FIG. 4A. The eight outlet holes OH through the exhaust ring ER are arranged in an arc (i.e. a short series of outlet holes OH) which extend down through rotatable exhaust ring ER are spaced over an angle α. In the embodiment shown here, angle α is about 43° which is within a preferred range of angles from about 30 degrees to about 60 degrees. The rotating gas exhaust ring ER which with its short arc of outlet holes OH spaced along the narrow angle α directs and temporarily restricts the paths of movement of the ionized gaseous species which pass along ever changing paths from the vent holes VH, across the wafer W and then through the outlet holes OH at their ever changing angles around the wafer W. Thus, it is believed now to be manifest that the outlet holes OH are rotating about the wafer W in order to change the paths (angles) along which the ions in the plasma in the ionization space IS can move across the wafer W to etch all of the various surfaces of the wafer W during rotation of the outlet ring OR.

The outlet ring OR is rotated continuously at a speed from about 1 rpm to about 15 rpm while the wafer W is stationary as shown in FIGS. 4A, 4B, and 4C which are shown in instant locations of the outlet holes OH at three locations selected for purposes of illustration.

This technique has the advantage that although at any given moment a gas-flow-shadow SA exists as in FIGS. 2A and 2B, the gas-flow-shadow SA is eliminated only moments later, as soon as the outlet holes OH move to the next position in FIGS. 4B and the third position seen in FIG. 4C and back to the position seen in FIG. 4A and beyond as the exhaust ring ER continues to rotate until the RIE process is completed.

As is well known by those skilled in the art, the wafer W must be clamped in position by clamp ring CR which is shown in the retracted position for convenience of illustration of the key features of this invention. Clamp ring CR is required to retain wafer W in position as thermally conductive gas is caused to flow from vent paths (not shown) through the lower electrode LE under wafer W, to maintain and control the wafer temperature, as is also well known by those skilled in the art and is not a novel aspect of the apparatus of this invention.

Figure 2A:
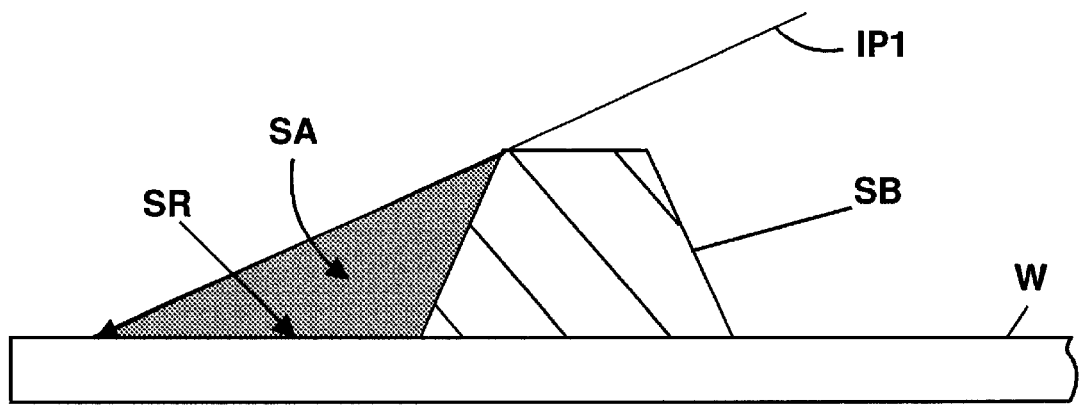
FIG. 2A shows a Prior Art ion path hypothetically followed by an ion travelling along a straight line just missing interception by the upper edge of a solder bump on a wafer from a point source, i.e. a vent hole in FIG. 1A creating a shadow area behind the solder bump.
Figure 2B:
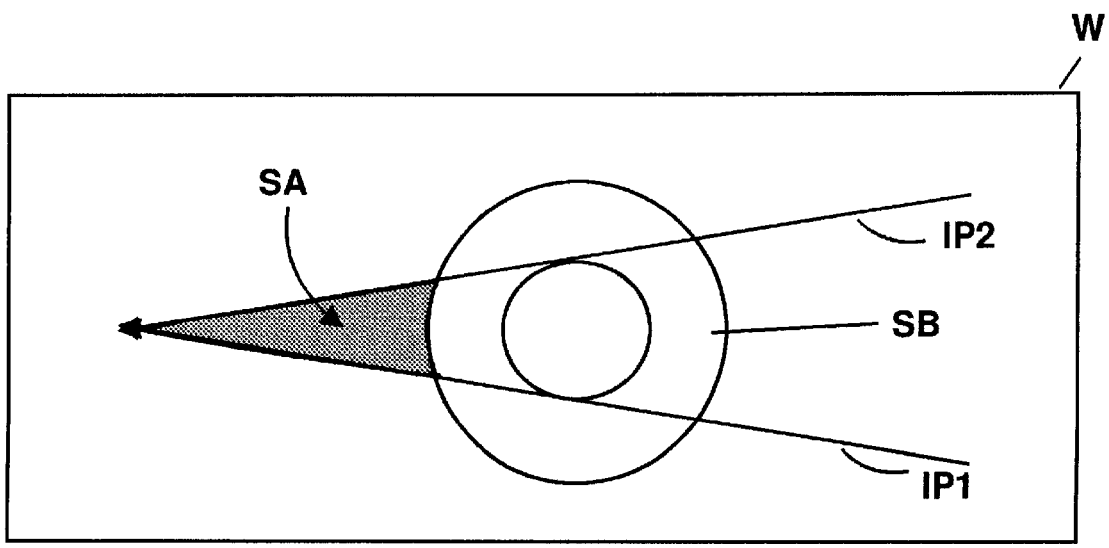
FIG. 2B is a plan view of two Prior Art ion paths affected by the solder bump on the wafer of FIG. 2A.
Figure 7A:
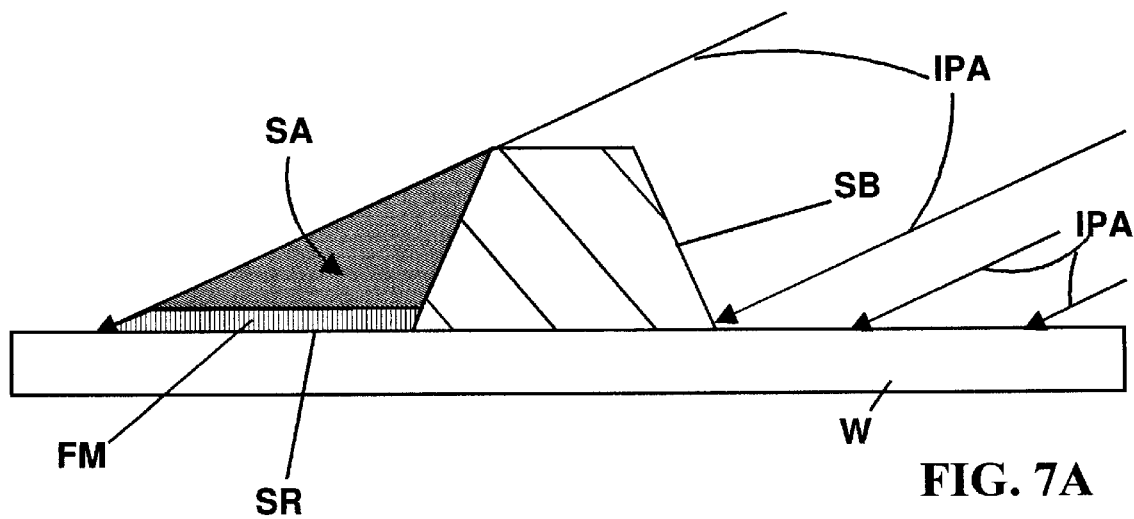
FIGS. 7A and 7B show the result of using the system of FIGS. 3 and 4A–4C as contrasted with the problem illustrated by FIGS. 2A and 2B.
Figure 7B:
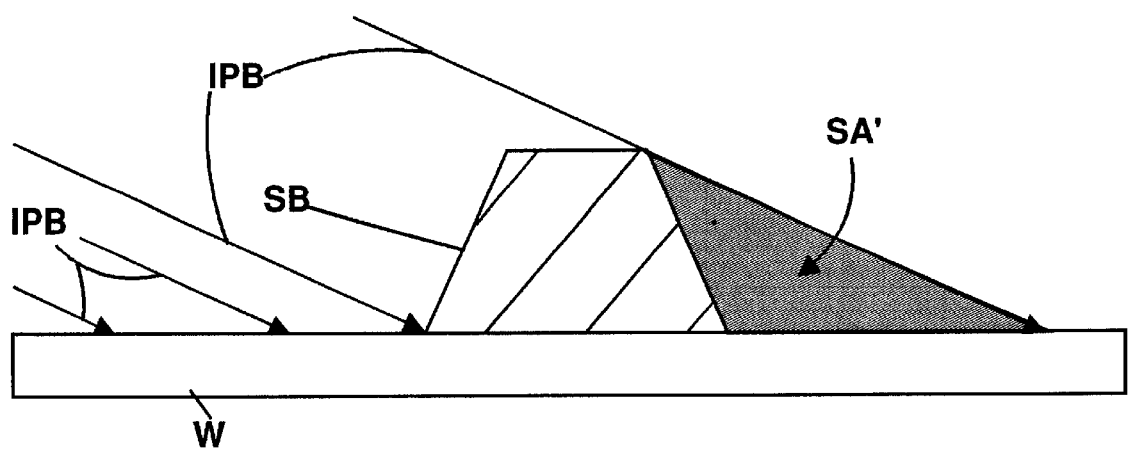

FIGS. 7A and 7B show the result of using the system of FIGS. 3 and 4A–4C as contrasted with the problem illustrated by FIGS. 2A and 2B.

FIG. 7A shows a wafer W which was initially coated with an unwanted film FM, after etching at the early stage of the process reached at the position of the exhaust ring ER shown in FIG. 4A. In FIG. 7A, in the initial position of the outlet ring OR there is a gas-flow-shadow SA formed by the solder bump SB on the left side thereof on the surface of wafer W. The gas-flow-shadow SA cast on shadow region SR to the left of bump SB has protected the film FM from substantial etching by the RIE while the ion path IPA has removed the film FM on the right side of bump SB. Note that ion path IPA has been broadened to cover the width of the section of wafer W illustrated for convenience of illustration and the path lines are drawn parallel, for ease of illustration, although the ion paths actually diverge to a slight degree from parallel depending upon the geometric relationship between the vent holes VH and the outlet holes OH.

FIG. 7B shows the result of use of the RIE system of FIG. 3 after the exhaust ring ER has rotated 180° to the opposite position from the position shown in FIG. 7A. The result is that the gas-flow-shadow SA from ion path IPB has moved to the right side of bump SB leaving the left side of bump SB exposed, so the film FM has been etched away by the ion path IPB. Thus, after the outlet ring OR has turned 180° the ionized gaseous species in the ionization space IS flowing from the inside (center of the wafer W) towards the edge of the wafer W tend to flow in the opposite direction from the direction of flow in FIG. 7A eliminating the shadow SA which is replaced by the shadow SA' in FIG. 7B.

Second Embodiment

Figure 5:
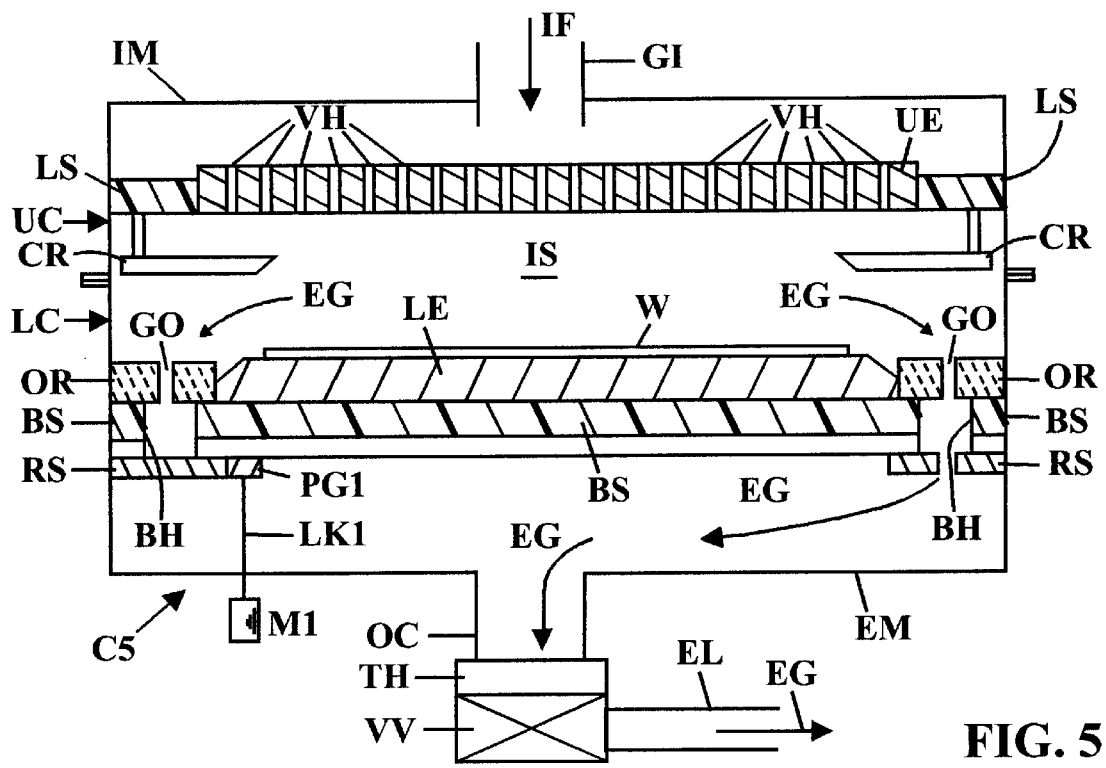
FIG. 5 shows an RIE chamber which is a modification of the chamber of FIG. 3 in which an output ring which remains in fixed position and a rotating shutter have replaced the rotating exhaust ring of FIGS. 3 and 4A–4C.

FIG. 5 shows an RIE chamber C2 which is a modification of the chamber C2 of FIG. 3. The difference is that an output ring OR which remains in fixed position and a rotating shutter RS have replaced the rotating exhaust ring ER of FIGS. 3 and 4A–4C. The rotating shutter RS is located below the lower electrode LE and the base BS.

Figure 6A:
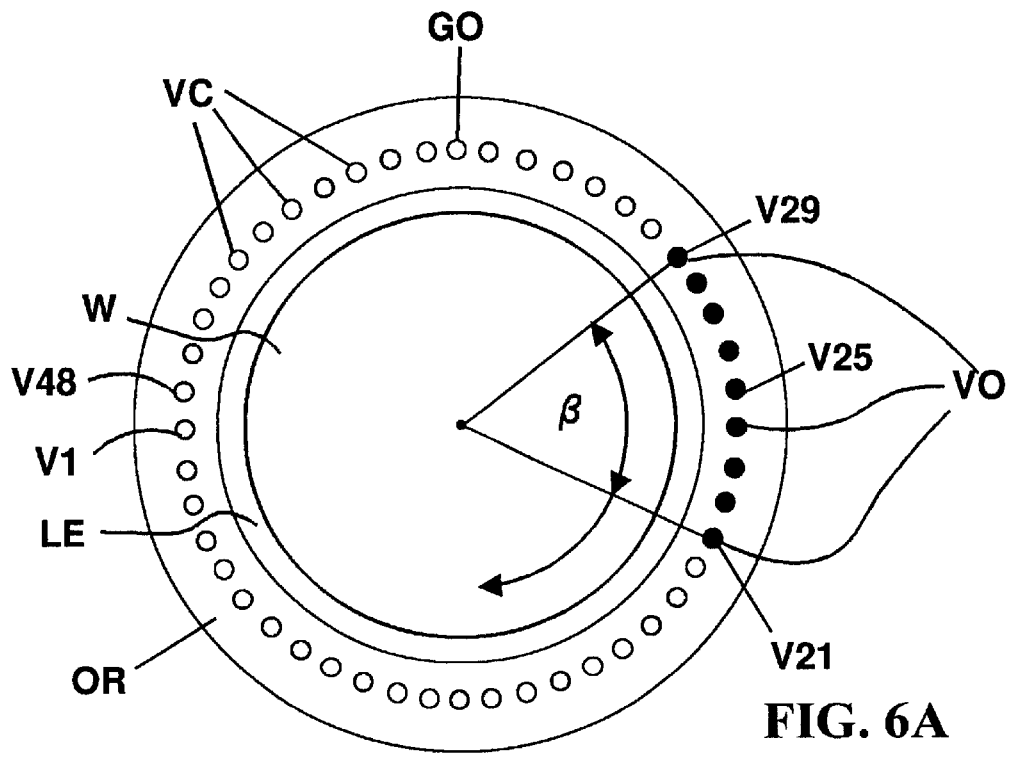
FIGS. 6A and 6B show plan views of a portion of FIG. 5 including only the output ring, the lower electrode and the wafer.
Figure 6B:
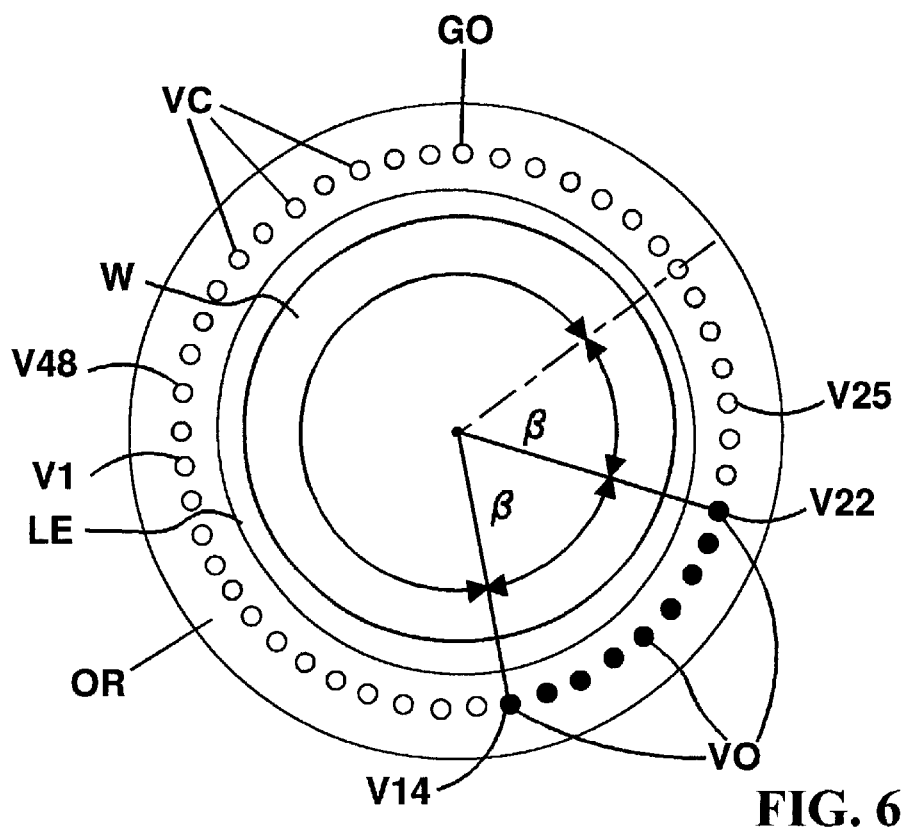

FIGS. 6A and 6B show plan views of a portion of FIG. 5 including only the output ring OR, the lower electrode LE and the wafer W. The output ring OR has gas outlets GO spaced uniformly about the output ring OR as shown in FIGS. 6A and 6B which shows the output ring OR with closed valves VC indicated by clear circles and open valves VO indicated by blackened circles for two successive positions of the rotating shutter RS. In FIG. 6A, the angle β from the starting point on the wafer W is shown. In FIG. 6B, after the rotating shutter RS has turned an additional angle β or a total angle of 2β of open valves VO in the successive positions of the rotating shutter RS. It will be well understood by those skilled in the art that the rotating shutter RS will continue to turn so that the remainder of the closed valves VC will be opened successively, turning in the clockwise direction as seen in FIGS. 6A and 6B.

The rotating shutter RS which is turned by a pinion gear PG1 which meshes with gear teeth on the exterior of the shutter RS. Motor M1 rotates link LK1 which turns the pinion gear PG1. The rotating shutter RS continues to rotate around and around the lower electrode like the exhaust ring ER until the process being performed has been finished so that all of the unwanted material in the shadow areas has been etched away by the successive opening of all of the gas outlets GO by continued turning through a series of overlapping positions of the rotating shutter RS to open all of the valves VC in sequence as the shutter turns on its axis impelled by the turning of the pinion gear PG1.

Referring again to FIGS. 7A and 7B, the shadow SA is formed in the initial position of the rotating shutter RS by the solder bump SB. Then as the rotating shutter RS turns, at a later time, the ionized gaseous species in the ionization space IS flowing from the inside (center of the wafer W) towards the edge of the wafer W tend to flow in the opposite direction from the direction of flow in FIG. 7A so that the shadow SA has been replaced by the shadow SA' in FIG. 7B. Thus the shadow region SR of FIG. 7A has been eliminated in FIG. 7B.

Third Embodiment

Figure 8:
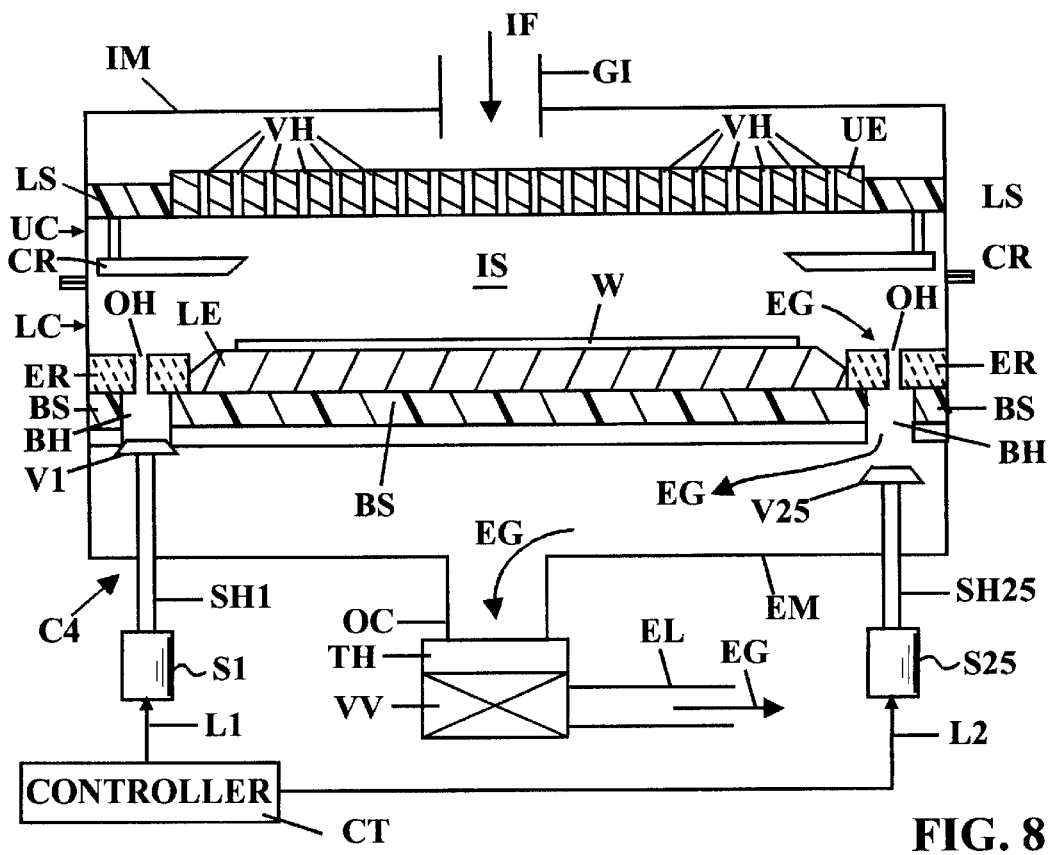
FIG. 8 shows a RIE system in accordance with this invention which uses solenoid operated valves operated in a sequence to control the outlet holes shown in FIGS. 6A and 6B in a sequence similar to that provided in the second RIE system of FIG. 5.

FIG. 8 shows a RIE system in accordance with this invention which uses an solenoid operated valves operated in a sequence to control the outlet holes OH shown in FIGS. 6A and 6B in a sequence similar to that provided in the second RIE system of FIG. 5.

In FIG. 8, the RIE system C4 an electromechanical design is used to control the 48 outlet holes OH shown in FIGS. 6A and 6B in a sequence similar to that provided in the second embodiment with the system of FIG. 5 with a complete circle of outlet holes 48 at the periphery of the wafer W in the exhaust ring ER and each hole OH being adapted to be closed or opened by electro-mechanically means of apparatus including valves V1, . . . V25, etc. In this design (in a normally closed mode), a selected pattern of the holes OH is opened in a sequence which allows the equivalent of rotation of open outlet holes OH to affect etching at various positions. That eliminates the gas-flow-shadowing (FIG. 4A, FIG. 4B). In this embodiment, both the lower electrode plate LE and the wafer W are stationary but the rotation of the sequence of opening of valves provides the equivalent of rotation of open valves. The valves V1, . . . V24, etc. open and close in a sequence controlled by a controller CT which operates solenoids S1, . . . S25, etc. in a program as indicated by FIGS. 6A and 6B or the like. Solenoids S1 and S25 are connected to shafts SH1 and SH25 respectively to close valve V1 and open valve V25 at the specific instant in time shown in FIG. 8. and FIG. 6A where valves V21 to V29 are the only valves which are open. In FIG. 6B both valves V1 and V25 are closed since the valves V14 to V22 in the arc from the angle β to the angle 2β are the only valves which are open.

Fourth Embodiment

Figure 9:
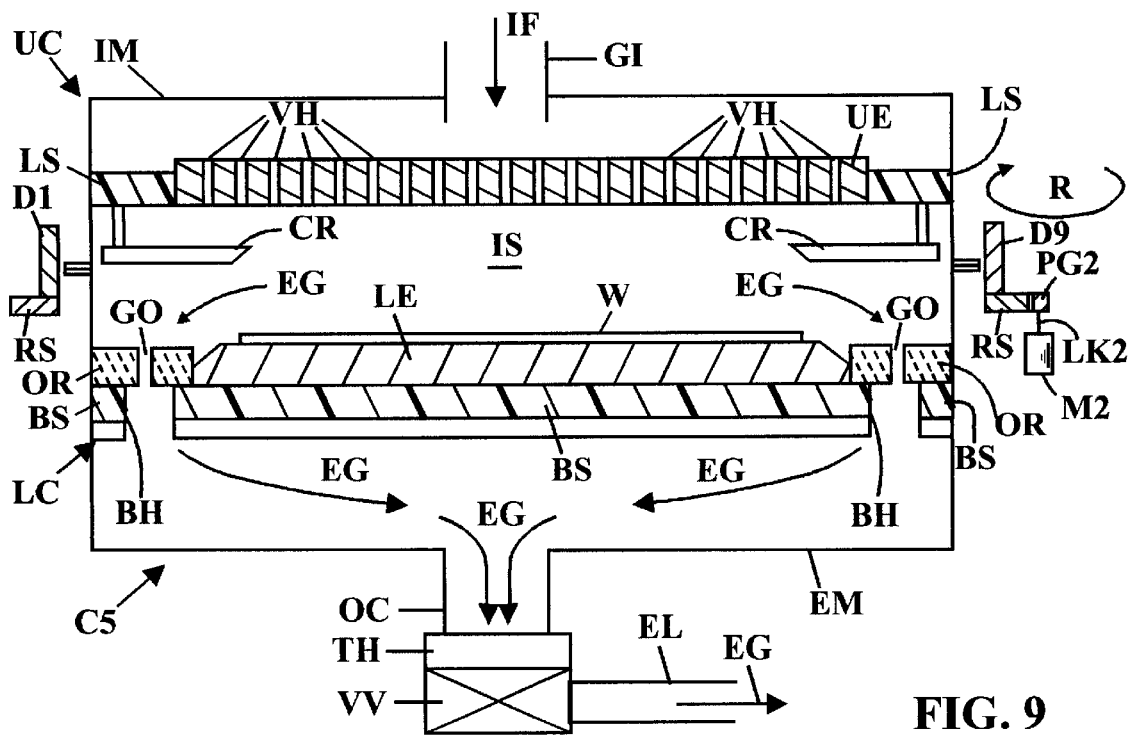
FIG. 9 shows an RIE system in accordance with this invention which rotates the plasma by means of a magnetic field formed by a rotating support ring arranged around a chamber. The support ring carries therewith a set of permanent magnetic dipoles which in turn rotate the plasma.

FIG. 9 shows an RIE system in accordance with this invention which rotates the plasma by means of a magnetic field formed by a rotating set of permanent magnetic dipoles D1–D16 arranged around a chamber C5 rotating the plasma therewith. In FIG. 9 the RIE chamber C5 is surrounded by a ring RS coaxial with the chamber C5 rotates carrying a plurality of permanent magnetic dipoles D1–D16 with North/South pole axes parallel to the axis of the ring RS rotate about the chamber C5 thereby rotating the ionized plasma therewith by magnetic field coupling. The RIE chamber C5 of FIG. 9 is similar to the chamber C4 of FIG. 8 with the solenoid operated valves V1, . . . V25, . . . removed.

Figure 10:
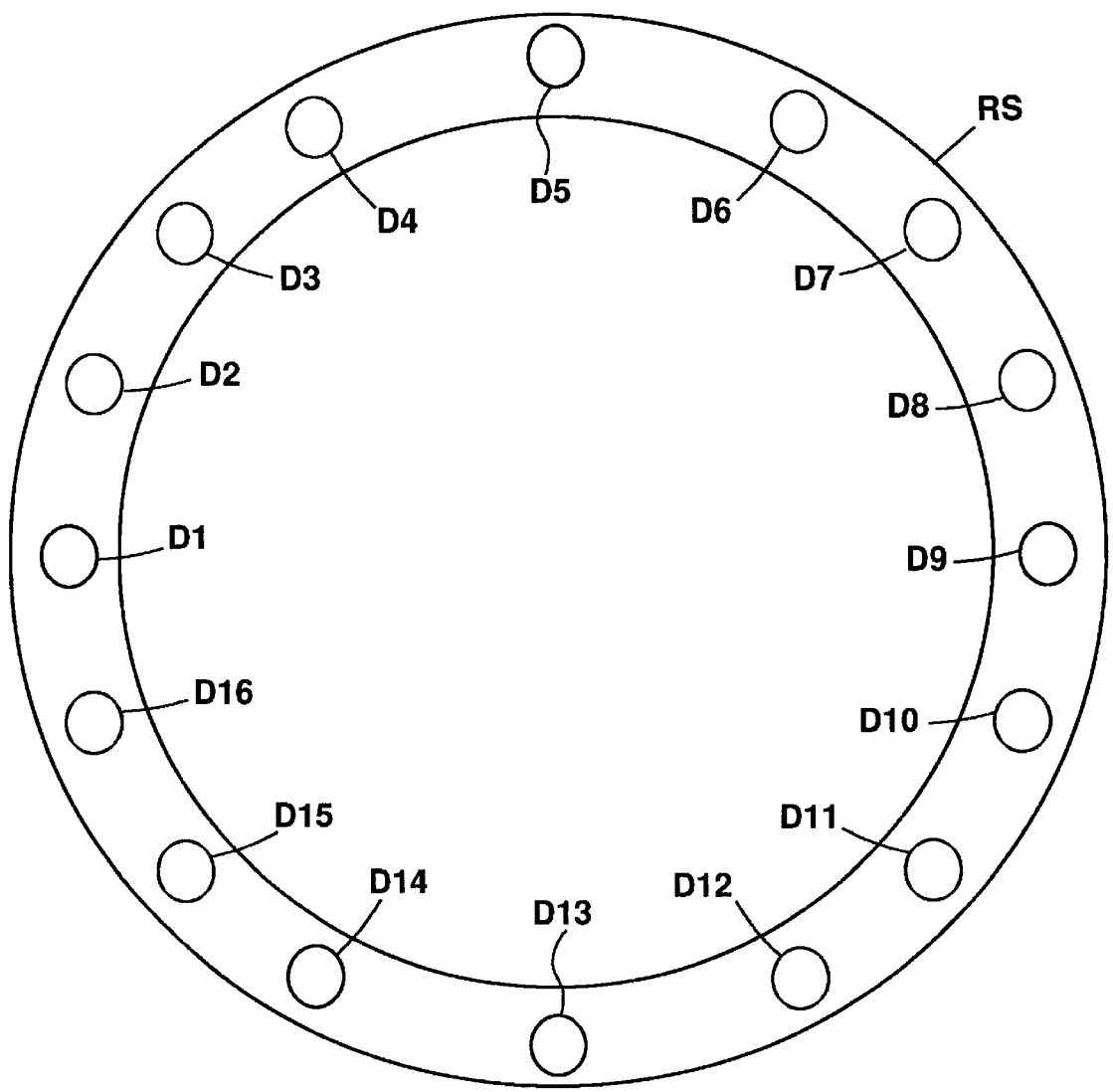
FIG. 10 is a partial plan view of FIG. 9 showing the rotating support ring carrying the permanent magnetic dipoles which are equally spaced thereabout.

FIG. 10 is a partial plan view of FIG. 9 showing the rotating support ring RS and the sixteen magnetic dipoles D1–D16 of FIG. 9 arranged about the rotating support ring RS.

Figure 11:
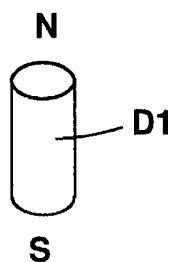
FIG. 11 is a perspective view of a single permanent magnetic dipole of FIGS. 9 and 10.

FIG. 11 is a perspective view of a single permanent magnetic dipole D1.

The system of FIG. 9 rotates the plasma in the ionization space IS by means of a magnetic field formed by a rotating set of dipoles D1–D16 arranged around the periphery of the RIE chamber C5. The dipoles D1–D16 arc supported upon a rotating support ring RS which cause rotation of a magnetic field parallel to the axis of the chamber CS. The rotating magnetic field generates rotation of the gaseous species to magnetic field to eliminate the gas-flow-shadow. The rotating support ring RS is formed concentric with the chamber CS. The rotating C support RS carries sixteen (16) permanent magnetic dipoles D1–D16 with North poles on the top and South poles on the bottom thereof; and the rotating support RS is turned by a second pinion gear PG2 which is driven by a link LK2 and a motor M2.

Fifth Embodiment

Figure 12A:
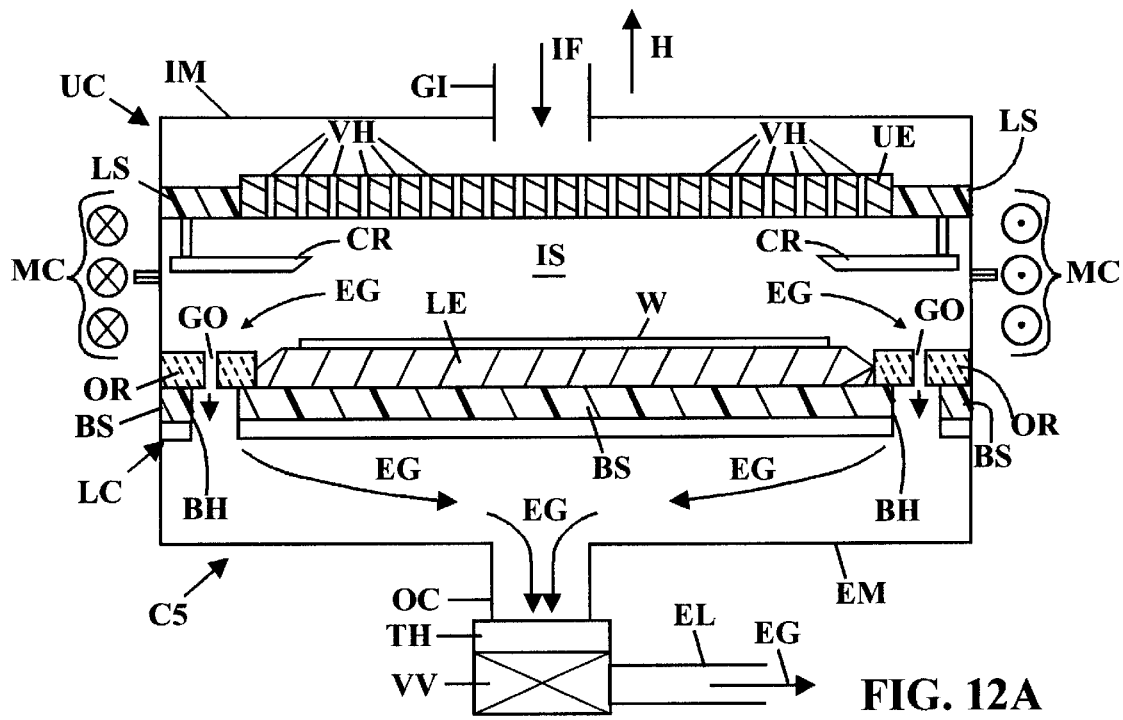
FIGS. 12A and 12B show a modification of the chamber of FIG. 9.
Figure 12B:
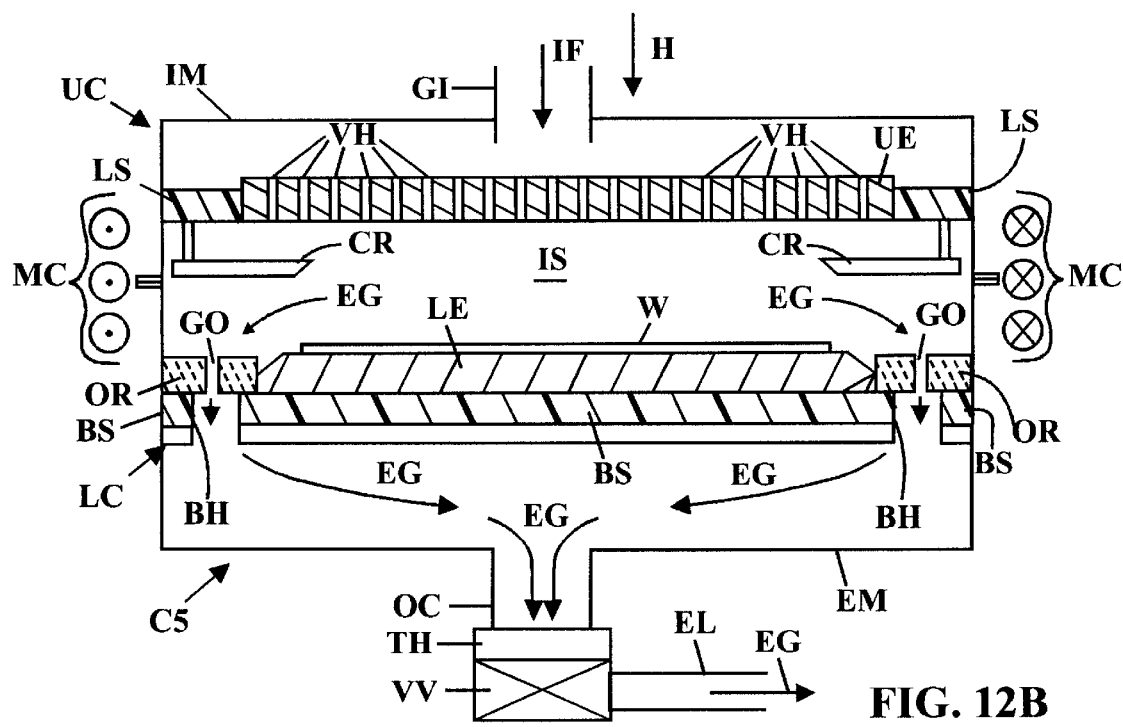

In the fifth embodiment an RIE chamber C6, which is shown in FIGS. 12A and 12B, is a modification of the chamber C5 of FIG. 9. In chamber C6, the dipoles D1, etc. and the rotating support RS, etc have been replaced by an electromagnetic coil MC which is provided to oscillate the direction of rotation of the plasma. The oscillation of the direction of rotation of the plasma is created by using a magnetic field formed by a helical electromagnetic coil MC wound around the chamber C6 to generate a coaxially oriented magnetic field which rotates the gaseous species clockwise for one direction of current through the coil MC and rotates the gaseous species anti-clockwise by reversing the magnetic field. The reversal in the direction of rotation of the ionized gaseous species in the plasma is caused by reversing the direction of the electrical current in the electromagnetic coil MC as shown by FIGS. 12A and 12B where the current is reversed in direction in the coil MC from clockwise in FIG. 12A to counterclockwise in FIG. 12B. The resulting reversal in the direction of the rotating magnetic field generates reversals in the direction of rotation of the ions of the gaseous species. Thus the reversals of the magnetic field causes exposure of the previously unexposed surfaces of the wafer W behind high features such as solder bumps and thus eliminates the gas-flow-shadows.

SUMMARY (1) This invention solves a unique problem of gas-flow-shadow formation due to blocking of ions traversing an ionization space such as tall features on a wafer surface or asperities on a workpiece surface.

(2) This invention teaches a unique solution that process gases have to exhaust in a sequential asymmetric non-radial manner to eliminate the gas-flow-shadow effect.

(3) Systems and methods in accordance with this invention may combined with a rotating/oscillating magnetic/electromagnetic field to further enhance the gas-flow-shadow elimination process.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by letters patent is as follows:

1. A method of performing Reactive Ion Etching (RIE) comprising:

providing an RIE chamber, providing a work supporting surface comprising a first electrode, providing a second electrode confronting the first electrode combined therewith to form an ionization space above the work supporting surface in the chamber, providing a plurality of peripheral exhaust openings arranged on the periphery of the ionization space, supplying a reactive species into the ionization space, forming a plasma of the reactive species in the ionization space between the inlet electrode and the first electrode provided by the work supporting surface, and imparting vector forces to the plasma of said reactive species diverting the paths thereof with continuously varying vectors by imparting vector forces directing the reactive species along non-linear paths along continuously changing direction as a function of time by sequentially rotating access to the peripheral exhaust openings about the ionization space mechanically, whereby the reactive species follow non-linear paths continuously changing direction with time thereby counteracting shadow effects of the RIE process relative to tall structures and asperities on workpiece surfaces.

2. A method of performing Reactive Ion Etching (RIE) comprising:

providing an RIE chamber, providing a work supporting surface comprising a first electrode, providing a second electrode confronting the first electrode combined therewith to form an ionization space above the work supporting surface in the chamber, providing peripheral exhaust openings on the periphery of the ionization space, supplying a reactive species into the ionization space, forming a plasma of the reactive species in the ionization space, imparting vector forces to the plasma of said reactive species diverting the paths thereof with continuously varying vectors by a method for imparting vector forces, directing the reactive species along non-linear paths thereby continuously changing the direction thereof as a function of time, with the step of imparting vector forces by mechanically rotating access to the peripheral exhaust openings about the ionization space, and the step of rotation of access to the peripheral exhaust openings is provided along a limited arc, whereby the reactive species follow non-linear paths continuously changing direction with time thereby counteracting shadow effects of the RIE process relative to tall structures and asperities on workpiece surfaces.

3. The method of claim 2 wherein the vectors are applied by rotation of access to and through the peripheral exhaust openings.

4. The method of claim 2 wherein the rotation of access to and through the peripheral exhaust openings is provided by sequential operation of valves or shutters to control access to and through the exhaust openings along a limited are.

5. The method of claim 1 wherein:

inlet gases arc directed through a plurality of widely dispersed inlet openings formed through the second electrode, the inlet openings being directed towards the work supporting surface, and the vectors are applied by sequential rotation of opening and closing of access to the peripheral exhaust openings.

6. The method of claim 1 wherein the vectors are applied sequentially by rotation of a shutter thereby opening and closing access to and through the peripheral exhaust openings.

7. A Reactive Ion Etching (RIE) system comprising:

an RIE chamber, a work supporting surface comprising a first electrode located in the RIE chamber, a second electrode located in the chamber and confronting the first electrode combined therewith to form an ionization space above the work supporting surface in the RIE chamber, a plurality of peripheral exhaust openings located on the periphery of the ionization space, distribution means for supplying a reactive species into the ionization space, plasma means for forming a plasma of the reactive species in the ionization space between the first and second electrodes thereby directing the reactive species along non-linear paths that continuously change direction as a function of time, vector means for imparting vector forces to the plasma of the reactive species diverting the paths thereof with continuously varying vector, directing the reactive species along non-linear paths along continuously changing direction as a function of time, the means for imparting vector force being mechanical means for sequentially providing rotation of access to the peripheral exhaust openings about the ionization space mechanically, whereby the reactive species follow non-linear paths continuously changing direction with time thereby counteracting shadow effects of the RIE process relative to tall structures and asperities on workpiece surfaces.

8. The system of claim 7 wherein the rotation of access to and through the peripheral exhaust openings is provided along a limited arc.

9. The system of claim 8 wherein the vectors are applied by rotation of access to and through the peripheral exhaust openings.

10. The system of claim 8 wherein the rotation of access to and through the peripheral exhaust openings is provided by sequential operation of valve or shutter means along a limited arc.

11. The system of claim 7 wherein the vectors are applied by access means for sequential rotation of opening and closing of access to the peripheral exhaust openings.

12. The system of claim 7 wherein the vectors are applied sequentially by rotation of a shutter thereby opening and closing access to and through the peripheral exhaust openings.

13. The method of claim 1 wherein the inlet gases are directed through a plurality of widely dispersed inlet openings formed through the second electrode, directed through means formed through the second electrode, the inlet means being directed towards the work supporting surface.

14. The method of claim 1 wherein the exhaust openings are arranged substantially uniformly along an arc.

15. The system of claim 7 wherein the inlet gases are directed through a plurality of widely dispersed inlet openings formed through the second electrode, directed through means formed through the second electrode, the inlet means being directed towards the work supporting surface.

16. The system of claim 7 wherein the exhaust openings are a arranged substantially uniformly along an arc.

* * * * *